United States Patent [19]
Masuda et al.

[11] Patent Number: 5,710,736
[45] Date of Patent: Jan. 20, 1998

[54] SEMICONDUCTOR STORAGE DEVICE

[75] Inventors: Shinichi Masuda; Takashi Hashimoto, both of Tokyo, Japan

[73] Assignees: Mitsubishi Electric Engineering Co., Ltd.; Mitsubishi Denki Kabushiki Kaisha, both of Chiyoda-ku, Japan

[21] Appl. No.: 756,822

[22] Filed: Nov. 26, 1996

[30]        Foreign Application Priority Data

Jul. 17, 1996  [JP]  Japan ................................. 8-187613

[51] Int. Cl.⁶ ........................................... G11C 7/00
[52] U.S. Cl. ........................ 365/139.07; 365/207
[58] Field of Search ................... 365/189.07, 207, 365/227, 189.05

[56]            References Cited

U.S. PATENT DOCUMENTS 5,258,950  11/1993  Murashima et al. ............... 365/189.07
5,434,819   7/1995  Matsuo et al. .................... 365/189.07
5,594,695   1/1997  Yim et al. ......................... 365/189.07
5,642,317   6/1997  Furutani ........................... 365/189.07

FOREIGN PATENT DOCUMENTS 2-154392   6/1990  Japan .
5-274885  10/1993  Japan .

*Primary Examiner*—Son T. Dinh
*Attorney, Agent, or Firm*—Burns, Doane, Swecker & Mathis, LLP

[57]            ABSTRACT

It is an object to provide a semiconductor storage device having an optimized sense enable time to reduce unnecessary power consumption. An output node (N1) of a sense amplifier (SA) is connected to an input of a tristate buffer (delay means) (TB) and an output node (N2) of the tristate buffer (TB) is connected to an input of an inverter (I1) forming data holding means (L1). The output nodes (N2 and N3) are connected to inputs of an EXNOR circuit (G1) and an output node (N4) of the EXNOR circuit (G1) is connected to a reset circuit (RS).

10 Claims, 11 Drawing Sheets

SEMICONDUCTOR STORAGE DEVICE

BACKGROUND OF THE INVENTION

1. Field of the Invention

The present invention relates to semiconductor storage devices, and particularly to a semiconductor storage device with an optimized sense enable time.

2. Description of the Background Art

FIG. 14 shows structure of an SRAM (static RAM) 90 which performs input/output of 1-bit data as an example of a conventional semiconductor storage device.

As shown in FIG. 14, a plurality of memory cells MC1–MCn are connected between bit lines BL and $\overline{BL}$ to constitute a memory cell column CC. Word lines WL1–WLn extending from an address decoder are connected to the memory cells MC1–MCn, respectively. A plurality of such memory cell columns CC are arranged in parallel and the bit lines BL and $\overline{BL}$ extending from each memory cell column CC are connected to a column selector CS.

Input/output lines IO and $\overline{IO}$ extend from the column selector CS, which are connected to a positive input and a negative input of a sense amplifier SA in a read block RB. The input/output lines IO and $\overline{IO}$ are also connected to an output and an inversion output of a write driver WD.

The output node N1 of the sense amplifier SA is connected to an input of a tristate buffer TB. In this structure, a sense enable signal SE is supplied to the sense amplifier SA and the tristate buffer TB, which enter an active or an inactive state in response to the sense enable signal SE. In the active state, a potential difference of signals read onto the bit lines BL and $\overline{BL}$ is amplified and outputted from the output node N2.

The output node N2 of the tristate buffer TB is connected to an input of an inverter I1 constituting data holding means L and the output node N3 of the inverter I1 is connected to an input of an inverter I2. Here, the output node N2 of the tristate buffer TB is also connected to the output of the inverter I2 to form a loop path, and the output node N11 is connected to an input of an output buffer OB and the output of the output buffer OB is connected to a data output port DO.

The write driver WD is supplied with a write enable signal WE, which enters an active or an inactive state in response to the write enable signal WE. In the active state, data inputted from the data input port DI is complementarily outputted to the input/output lines IO and $\overline{IO}$.

Next, write and read operations of the SRAM 90 will be briefly described. The data inputted from the data input port DI is amplified by the write driver WD which attains an active state in writing and complementarily outputted to the input/output lines IO and $\overline{IO}$. At this time, a write address signal inputted from the address input port AD is decoded by the address decoder ADD, and then any of the plurality of memory cell columns CC and any of the word lines WL1–WLn therein are selected to write the data into a memory cell connected to that word line.

When reading data from a desired memory cell, a read address signal which specifies that desired memory cell is inputted from the address input port AD to select any of the plurality of memory cell columns CC and any of the word lines WL1–WLn therein. When the desired memory cell is selected, data written therein is outputted to the input/output lines IO and $\overline{IO}$ through the bit lines BL and $\overline{BL}$. At this time, the sense amplifier SA and the tristate buffer TB in the read block RB are in an active state in response to the sense enable signal SE and the read data is amplified and outputted from the output node N2.

Now, referring to the timing chart shown in FIG. 15, operation of the read block RB will be described.

As shown in FIG. 15, the sense enable signal SE alternately and regularly exhibits an "H" state and an "L" state, where a set of the "H" state and the "L" state forms one cycle. In FIG. 15, the read data outputted to the input/output lines IO and $\overline{IO}$ are different in the cycle 1 and the cycle 2 of the sense enable signal SE and the read data outputted to the input/output lines IO and $\overline{IO}$ are the same in the cycle 2 and the cycle 3.

Now, the sense amplifier SA and the tristate buffer TB are constructed to enter an active state when the sense enable signal SE enters an "H" state. Accordingly, in the period in which the sense enable signal SE is in an "H" state (that is, in the period in which the sense amplifier SA and the tristate buffer TB are in an active state), the read data is amplified by the sense amplifier SA and the tristate buffer TB and outputted from the output node N2. Transmission delays occur in the sense amplifier SA and the tristate buffer TB, so that the output timing of the read data is slightly delayed at the output nodes N1 and N2.

The read data which has reached the data holding means L is inversion-amplified in the inverter I1 and outputted to the output node N3. A transmission delay occurs in the inverter I1, which delays the output timing of the read data at the output node N3 from that at the output node N2.

The read data at the output node N3 is provided to the inverter I2, which is inversion-amplified again and provided to the output buffer OB, where it is further amplified and provided to the data output port DO.

In the period in which the sense enable signal SE is in an "L" state (that is, in the period in which the sense amplifier SA and the tristate buffer TB are in an inactive state), the output node N1 of the sense amplifier SA is in a high-impedance state (a "HiZ" state).

Now, since the output of the inverter I2 is applied to the output node N2 of the tristate buffer TB, the output node N2 does not enter the "HiZ" state. The read data at the output node N3 maintains, or latches, the previous data for a certain period even when the sense enable signal SE goes to an "L" state.

Then, when the cycle 1 of the sense enable signal SE is finished and the cycle 2 starts, i.e., when the sense enable signal SE attains "H" again, the read data outputted to the input/output lines IO and $\overline{IO}$ differ in the cycle 1 and the cycle 2, so that the data latched in the data holding means L, i.e., the output node N3, is inverted from the "L" state to the "H" state after a certain time period has passed. Now, the period between the time at which the cycle 1 of the sense enable signal SE terminates and the cycle 2 starts (the leading edge mesial point of the sense enable signal SE) and the time at which the output node N3 is inverted from the "L" state to the "H" state (the leading edge mesial point at the output node N3) is referred to as a latch inversion time.

Since the read data outputted onto the input/output lines IO and $\overline{IO}$ are the same in the cycle 2 and the cycle 3 of the sense enable signal SE, the data latched in the data holding means L does not change even when the cycle 2 terminates and the cycle 3 starts, that is, when the sense enable signal SE attains "H" again.

In the conventional semiconductor storage device constructed as explained in the example of the SRAM 90, the sense enable signal SE exhibits an "H" state and an "L" state alternately and regularly. While the period in which the sense enable signal SE is in an "H" state corresponds to a so-called sense time, if the data previously read (the data latched in the data holding means L) and the data currently read are the same (e.g., the cycle 2 and the cycle 3 shown in FIG. 15), the sense time is not required any more once it is confirmed that the two data are the same.

When the data previously read (the data latched in the data holding means L) and the data currently read are different (e.g., the cycle 1 and the cycle 2 shown in FIG. 15), it is sufficient that the sense time extends, when it is short, until the output node N2 changes, or at most, until the data latched in the data holding means L, i.e., the output node N3, is inverted, that is, for the latch inversion time.

In the conventional semiconductor storage device, however, as shown in FIG. 15, the sense time continues even after the latch inversion time has passed, and the "H" state period of the sense enable signal SE still continues when the sensing is not needed any more.

The reason why the sense time includes not only the latch inversion time but also the sense unnecessary time is that it is difficult to correctly obtain the latch inversion time when designing because the time elapsing before the output node N2 changes and the latch inversion time vary depending on voltage characteristics and temperature characteristics of elements (such as transistors) and therefore it is necessary to set a margin in the sense time to prevent such a problem that the sense time is too short to complete the latch.

The sense amplifier SA is a differential amplifier for amplifying a fine bit line potential read from a memory cell and an input/output line potential. This includes a current mirror circuit, for example, in which a DC current always flows in an active state (i.e., in a sense state). Hence, the DC current continues flowing even in the sense unnecessary time, which causes a problem of consuming unnecessary power.

SUMMARY OF THE INVENTION

A first aspect of the present invention is directed to a semiconductor storage device comprising data reading means for reading data held in a memory cell. According to the present invention, the data reading means comprises sense amplifying means responsive to a read control signal periodically provided for amplifying and outputting the data, data holding means receiving an output of the sense amplifying means for temporarily holding the data and then outputting the data to an external output terminal, data comparing means for comparing held data outputted from the sense amplifying means in a first cycle of the read control signal and held in the data holding means and before-held data outputted from the sense amplifying means in a second cycle of the read control signal and not held in the data holding means yet to output its comparison result, and signal changing means connected to the data comparing means for changing the read control signal according to the comparison result, wherein the read control signal includes, in its one cycle, an activating signal for activating the sense amplifying means so that the data is amplified and outputted, and a deactivating signal for deactivating the sense amplifying means, and the signal changing means forces the activating signal to change to the deactivating signal when the comparison result exhibits a predetermined result.

Preferably, according to a second aspect of the present invention, in the semiconductor storage device, the predetermined result is a result showing that the before-held data and the held data differ, wherein the data comparing means has a combinational logic circuit having its one input connected to a node allowing detection of the held data and its other input connected to a node allowing detection of the before-held data, for outputting a pulse-like comparison result signal only when the before-held data and the held data differ.

Preferably, according to a third aspect of the present invention, in the semiconductor storage device, the data holding means has at least one first signal inverting means and at least one second signal inverting means connected in series, wherein the output of the sense amplifying means is applied to an input node of the at least one first signal inverting means and an output of the at least one second signal inverting means is connected to the external output terminal and also connected to the output side of the sense amplifying means to form a loop path, the node allowing detection of the held data is an output node of the at least one first signal inverting means, and the node allowing detection of the before-held data is the input node of the at least one first signal inverting means.

Preferably, according to a fourth aspect of the present invention, in the semiconductor storage device, the combinational logic circuit is an EXNOR circuit.

Preferably, according to a fifth aspect of the present invention, in the semiconductor storage device, the predetermined result is a result showing that the before-held data and the held data are the same, wherein the data comparing means includes a first combinational logic circuit having its one input connected to a node allowing detection of the held data and its other input connected to a node allowing detection of the before-held data, for outputting a pulse-like signal only when the before-held data and the held data differ, and a second combinational logic circuit receiving an output of the first combinational logic circuit and a pulse-like timing signal provided in correspondence with timing of supply of the activating signal, for outputting a pulse-like comparison result signal corresponding to the timing signal only when the before-held data and the held data are the same.

Preferably, according to a sixth aspect of the present invention, in the semiconductor storage device, the data reading means includes delay means interposed between the output portion of the sense amplifying means and the input portion of the data holding means for delaying the data for a predetermined period and outputting the data, wherein the data comparing means includes switching means receiving the output of the sense amplifying means and the output of the delay means, for outputting the output of the sense amplifying means in a period in which the activating signal of the read control signal is provided and outputting the output of the delay means in a period in which the deactivating signal of the read control signal is provided, and pulse generating means receiving the read control signal for generating the timing signal in correspondence with timing of supply of the activating signal, and the data holding means includes at least one first signal inverting means and at least one second signal inverting means connected in series, wherein an input node of the at least one first signal inverting means is supplied with the output of the sense amplifying means and an output of the at least one second signal inverting means is connected to the external output terminal and also connected to the output side of the sense amplifying means to form a loop path, wherein the node allowing detection of the held data is the input node of the at least one first signal inverting means, and the node allowing detection of the before-held data is the output node of the switching means.

Preferably, according to a seventh aspect of the present invention, in the semiconductor storage device, the first combinational logic circuit is an EXNOR circuit, and the second combinational logic circuit is an AND circuit.

Preferably, according to an eighth aspect of the present invention, in the semiconductor storage device, the predetermined result includes a first result showing that the before-held data and the held data differ and a second result showing that the before-held data and the held data are equal, wherein the data comparing means includes a first combinational logic circuit having its one input connected to a first node allowing detection of the held data and its other input connected to a second node allowing detection of the before-held data, for outputting a pulse-like first comparison result signal only when the before-held data and the held data differ, a second combinational logic circuit having its one input connected to a third node allowing detection of the held data and its other input connected to a fourth node allowing detection of the before-held data, for outputting a pulse-like signal only when the before-held data and the held data differ, a third combinational logic circuit receiving the output of the second combinational logic circuit and a pulse-like timing signal provided in correspondence with timing of supply of the activating signal, for outputting a pulse-like second comparison result signal corresponding to the timing signal only when the before-held data and the held data are the same, and a fourth combinational logic circuit receiving the output of the first combinational logic circuit and the output of the third combinational logic circuit, for outputting the first comparison result signal when the before-held data and the held data differ and outputting the second comparison result signal when the before-held data and the held data are the same.

Preferably, according to a ninth aspect of the present invention, in the semiconductor storage device, the data reading means includes delay means interposed between the output portion of the sense amplifying means and the input portion of the data holding means for delaying the data for a predetermined period and outputting the data, wherein the data comparing means includes switching means receiving the output of the sense amplifying means and the output of the delay means, for outputting the output of the sense amplifying means in a period in which the activating signal of the read control signal is provided and outputting the output of the delay means in a period in which the deactivating signal of the read control signal is provided, and pulse generating means receiving the read control signal for generating the timing signal in correspondence with timing of supply of the activating signal, and the data holding means includes at least one first signal and at least one second signal inverting means connected in series, wherein the output of the sense amplifying means is applied to an input node of the at least one first signal inverting means and an output of the at least one second signal inverting means is connected to the external output terminal and also connected to the output side of the sense amplifying means to form a loop circuit, the first node allowing detection of the held data is an output node of the at least one first signal inverting means, the second node allowing detection of the before-held data is the input node of the at least one first signal inverting means, the third node allowing detection of the held data is the input node of the at least one first signal inverting means, and the fourth node allowing detection of the before-held data is the output node of the switching means.

Preferably, according to a tenth aspect of the present invention, in the semiconductor storage device, the first combinational logic circuit is an EXNOR circuit, the second combinational logic circuit is an EXNOR circuit, the third combinational logic circuit is an AND circuit, and the fourth combinational logic circuit is an OR circuit.

According to the semiconductor storage device of the first aspect of the present invention, the data comparing means compares the held data which is held by the data holding means and the before-held data which has not held by the data holding means yet. When the result of the comparison provides a certain result, the signal changing means forces an activating signal of the read control signal for activating the sense amplifying means to change to a deactivating signal. This reduces the period in which the sense amplifying means is in an active state to reduce the power consumed in the sense amplifying means, thus providing a semiconductor storage device with reduced power consumption.

According to the semiconductor storage device of the second aspect of the present invention, when the result shows that the held data differs from the before-held data, a pulse-like comparison result signal is provided from the combinational logic circuit to the signal changing means to force the activating signal for activating the sense amplifying means into a deactivating signal. Thus, when the held data and the before-held data are different, that is, when read data are different in the first cycle and the second cycle, the period in which the sense amplifying means is in an active state is reduced and the power consumed in the sense amplifying means is reduced, thereby providing a semiconductor storage device with small power consumption.

According to the semiconductor storage device of the third aspect of the present invention, as the held data is detected from the output node of the at least one first signal inverting means of the data holding means and the before-hold data is detected from the input node of the at least one first signal inverting means, a time difference is caused between the held data and the before-held data by passage through the at least one first signal inverting means, which ensures comparison between the held data and the before-held data.

According to the semiconductor storage device of the fourth aspect of the present invention, using an EXNOR circuit as the combinational logic circuit allows supply of the pulse-like comparison result signal to the signal changing means in response to timing of change of the held data and the before-held data when these data are different.

According to the semiconductor storage device of the fifth aspect of the present invention, a pulse-like signal is outputted from the first combinational logic circuit only when the before-held data and the held data differ, and the pulse-like signal is compared with a timing signal in the second combinational logic circuit. Only when the pulse-like signal is not provided, that is, only when the before-held data and the held data are equal, a pulse-like comparison result signal corresponding to the timing signal is applied from the second combinational logic circuit to the signal changing means to force the activating signal for activating the sense amplifying means into a deactivating signal. Therefore, when the held data and the before-held data are the same, that is, when read data is the same in the first cycle and the second cycle, the period of an active state of the sense amplifying means is reduced to reduce power consumed in the sense amplifying means, thus providing a semiconductor storage device with low power consumption.

According to the semiconductor storage device of the sixth aspect of the present invention, the held data is detected from the input node of the at least one first signal inverting means and the before-held data is detected from the output node of the switching means. Thus a time difference is caused between the held data and the before-held data by passage through the delay means, which ensures the comparison between the held data and the before-held data. Furthermore, it includes pulse generating means which generates a timing signal in correspondence with the timing of supply of the activating signal, which eliminates the need of providing a timing signal from the outside.

According to the semiconductor storage device of the seventh aspect of the present invention, the use of an EXNOR circuit as the first combinational logic circuit allows the pulse-like signal to be outputted in correspondence with the timing of change of the held data and the before-held data when the data are different. When the pulse-like signal is not provided, that is, when the before-held data and the held data are the same, the use of the AND circuit as the second combinational logic circuit allows the pulse-like comparison result signal corresponding to the timing signal to be supplied to the signal changing means.

According to the semiconductor storage device of the eighth aspect of the present invention, when the result shows that the held data and the before-held data differ, a pulse-like first comparison result signal is provided to the signal changing means from the first combinational logic circuit to force the activating signal for activating the sense amplifying means into a deactivating signal. Only when the before-held data and the held data differ, a pulse-like signal is outputted from the second combinational logic circuit and the pulse-like signal is compared with the timing signal in the third combinational logic circuit. Only when the pulse-like signal is not applied, that is, only when the result shows that the before-held data and the held data are the same, a pulse-like second comparison result signal corresponding to the timing signal is applied to the signal changing means from the third combinational logic circuit to force the activating signal for activating the sense amplifying means into a deactivating signal. Therefore, when the held data and the before-held data differ, that is, when the read data differ in the first cycle and the second cycle, it is possible to reduce the period in which the sense amplifying means is in an active state. When the held data and the before-held data are the same, that is, when the read data are the same in the first cycle and the second cycle, the period in which the sense amplifying means is in an active state is also reduced. This considerably reduces the power consumed in the sense amplifying means, thereby providing a semiconductor storage device with low power consumption.

According to the semiconductor storage device of the ninth aspect of the present invention, the held data is detected from the output node of the at least one first signal inverting means of the data holding means and the before-held data is detected from the input node of the at least one first signal inverting means. This causes a time difference between the held data and the before-held data because of passage through the first signal inverting means, which ensures the comparison between the held data and the before-held data. Furthermore, the held data is detected from the input node of the at least one first signal inverting means and the before-held data is detected from the output node of the switching means. Therefore, a time difference occurs between the held data and the before-held data due to passage through the delay means. This ensures the comparison between the held data and the before-held data. Also, as it includes pulse generating means for generating a timing signal corresponding to the timing of supply of the activating signal, it is not necessary to supply the timing signal from the outside.

According to the semiconductor storage device of the tenth aspect of the present invention, as an EXNOR circuit is used as the first combinational logic circuit, the pulse-like first comparison result signal can be outputted in response to the timing of change of the held data and the before-held data when the data are different. As an EXNOR circuit is used as the second combinational logic circuit, the pulse-like signal can be outputted in response to the timing of change of the held data and the before-held data when the data differ. When the pulse-like signal is not provided, that is, when the result shows that the before-held data and the held data are the same, as an AND circuit is used as the third combinational logic circuit, the pulse-like second comparison result signal corresponding to the timing signal can be outputted. When the before-held data and the held data differ, as an OR circuit is used as the fourth combinational circuit, the first comparison result signal can be supplied to the signal changing means, and when the before-held data and the held data are the same, the second comparison result signal can be supplied to the signal changing means.

The present invention has been made to solve the problems described above, and it is an object of the present invention to provide a semiconductor storage device having an optimized sense enable time to reduce unnecessary power consumption.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. First Preferred Embodiment>

<A-1. Device Structure>

As a first preferred embodiment of a semiconductor storage device according to the present invention, structure and operation of an SRAM 100 performing input/output of 1-bit data will be described referring to FIG. 1 to FIG. 6.

<A-1-1. Entire Structure>

Figure 1:
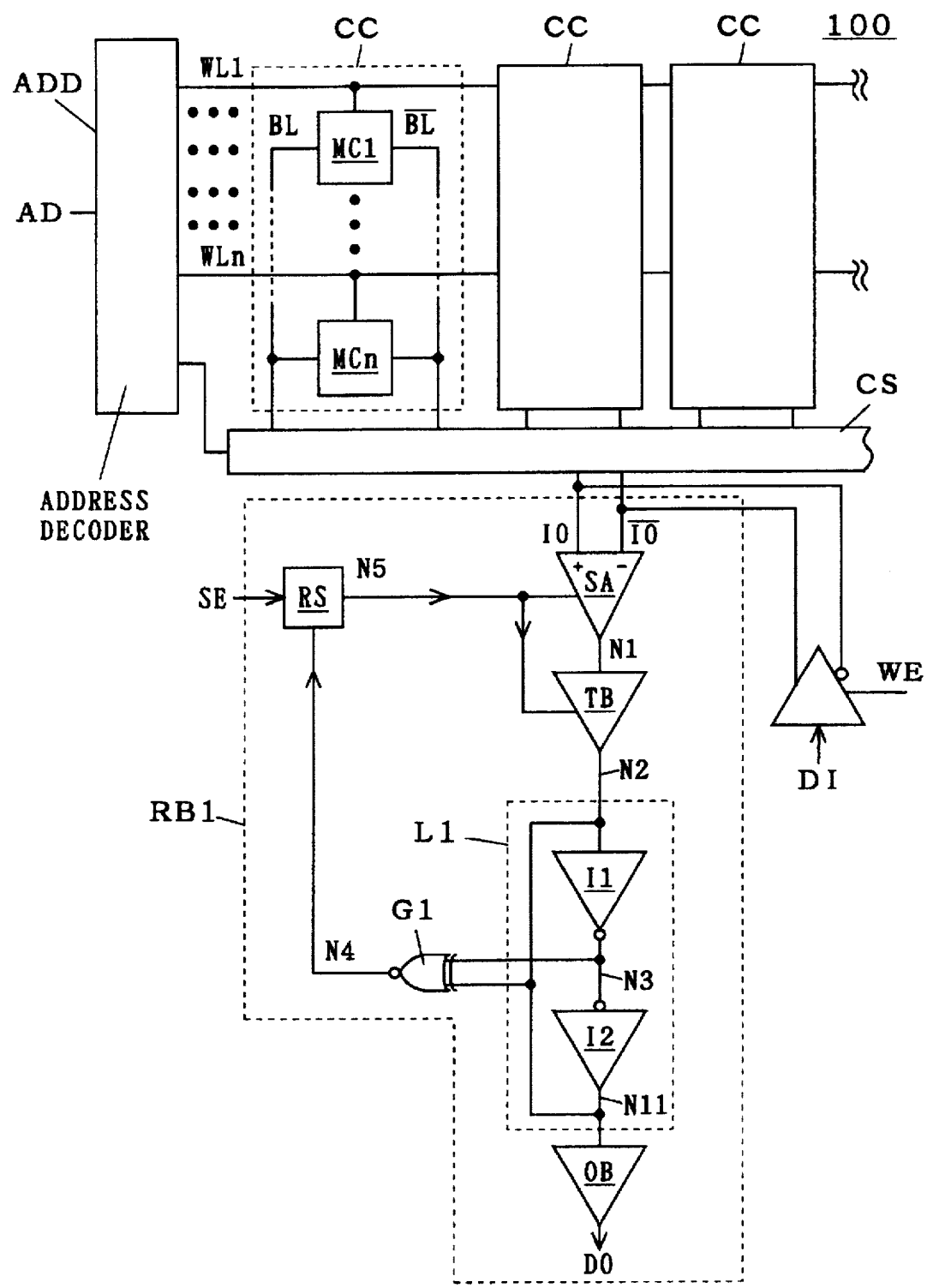
FIG. 1 is a diagram showing structure of a semiconductor storage device of a first preferred embodiment of the present invention.

FIG. 1 is a diagram showing the entire structure of the SRAM 100. As shown in FIG. 1, a plurality of memory cells MC1–MCn are connected between bit lines BL and $\overline{BL}$ to constitute a memory cell column CC. Word lines WL1–WLn extending from an address decoder are connected to the memory cells MC1–MCn, respectively. A plurality of such memory cell columns CC are arranged in parallel and the bit lines BL and $\overline{BL}$ extending from each memory cell column CC are connected to a column selector CS.

Input/output lines IO and $\overline{IO}$ extend from the column selector CS, which are connected to a positive input and a negative input of a sense amplifier SA in a read block RB1. The input/output lines IO and $\overline{IO}$ are also connected to an output and an inversion output of a write driver WD.

The output node N1 of the sense amplifier SA is connected to an input of a tristate buffer TB (delay means). The output node N2 of the tristate buffer TB is connected to an input of an inverter I1 constituting data holding means L1 and the output node N3 of the inverter I1 is connected to an input of an inverter I2. Here, the output node N2 of the tristate buffer TB is also connected to the output node N11 of the inverter I2 to form a loop path, and the output node N11 is connected to an input of an output buffer OB and the output of the output buffer OB is connected to a data output port DO.

The output nodes N2 and N3 are connected to inputs of an EXNOR circuit G1 and the output node N4 of the EXNOR circuit G1 is connected to a reset circuit RS. Here, the EXNOR circuit G1 can be called data comparing means for the reason explained later and the reset circuit RS can be called signal changing means for the reason explained later.

A sense enable signal SE (read control signal) is inputted to the reset circuit RS (signal changing means), and its output node N5 is connected to the sense amplifier SA and the tristate buffer TB, where the sense amplifier SA and the tristate buffer TB enter an active or an inactive state in response to the signal given from the output node N5. In the active state, they amplify a potential difference of the signals read onto the bit lines BL and $\overline{BL}$ and output it from the output node N2.

The write driver WD is supplied with a write enable signal WE, and it is brought to an active or an inactive state in response to the write enable signal WE. In the active state, it complementarily outputs data inputted from the data input port DI onto the input/output lines IO and $\overline{IO}$.

<A-1-2. Structure of Sense Amplifier>

Figure 2:
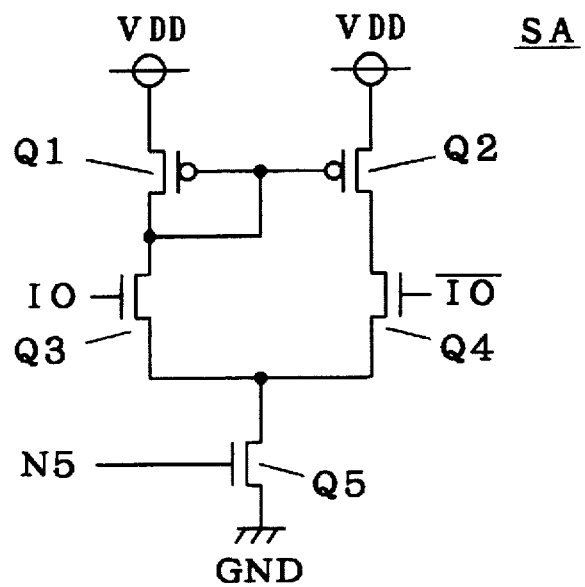
FIG. 2 is a diagram showing the structure of the sense amplifier.

FIG. 2 shows the structure of the sense amplifier SA. As shown in FIG. 2, the sense amplifier SA includes a current mirror circuit including PMOS transistors Q1 and Q2 and NMOS transistors Q3–Q5.

The PMOS transistor Q1 and the NMOS transistor Q3, and the PMOS transistor Q2 and the NMOS transistor Q4 are connected in series. The source electrodes of the PMOS transistors Q1 and Q2 are connected to the power-source potential $V_{DD}$ and the source electrodes of the NMOS transistors Q3 and Q4 are connected in common to the drain electrode of the NMOS transistor Q5. The source electrode of the NMOS transistor Q5 is connected to the ground potential GND.

Here, the gate electrodes of the PMOS transistors Q1 and Q2 are connected to the drain electrode of the NMOS transistor Q3 in common, and the connection node between the NMOS transistor Q2 and the NMOS transistor Q4 corresponds to the output node N1 of the sense amplifier SA. The input/output lines IO and $\overline{IO}$ are connected to the gate electrodes of the NMOS transistors Q3 and Q4, respectively, and the output node N5 of the reset circuit RS is connected to the gate electrode of the NMOS transistor Q5.

In the sense amplifier SA having such structure, when the output node N5 is in an "L" state, the output node N1 is in a high-impedance state ("HiZ" state).

<A-1-3. Structure of Tristate Buffer>

Figure 3:
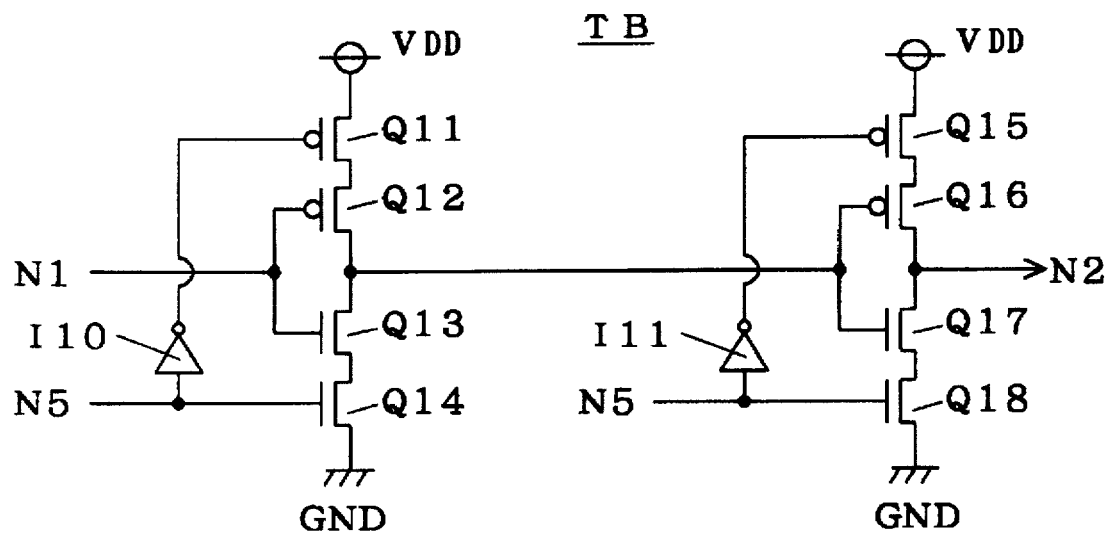
FIG. 3 is a diagram showing the structure of the tristate buffer.

FIG. 3 shows the structure of the tristate buffer TB. As shown in FIG. 3, the tristate buffer TB has a ante-stage circuit including PMOS transistors Q11, Q12 and NMOS transistors Q13, Q14 connected in series in order between the power-source potential $V_{DD}$ and the ground potential GND, and an inverter I10 having its input side connected to the gate electrode of the NMOS transistor Q14 and its output side connected to the gate electrode of the PMOS transistor Q11, and a post-stage circuit including PMOS transistors Q15, Q16 and NMOS transistors Q17, Q18 connected in series in order between the power-source potential $V_{DD}$ and the ground potential GND and an inverter I11 having its input side connected to the gate electrode of the NMOS transistor Q18 and its output side connected to the gate electrode of the PMOS transistor Q15.

In the ante-stage circuit, the gate electrodes of the PMOS transistor Q12 and the NMOS transistor Q13 are connected in common to the output node N1 of the sense amplifier SA and the output node N5 of the reset circuit RS is connected to the gate electrode of the NMOS transistor Q14.

In the post-stage circuit, the gate electrodes of the PMOS transistor Q16 and the NMOS transistor Q17 are connected to the connection node between the PMOS transistor Q12 and the NMOS transistor Q13 in common and the connection node between the PMOS transistor Q16 and the NMOS transistor Q17 corresponds to the output node N2 of the tristate buffer TB. The output node N5 of the reset circuit RS is connected to the gate electrode of the NMOS transistor Q18.

In the tristate buffer TB having such structure, the output node N2 is in a high-impedance state ("HiZ" state) when the output node N5 is in an "L" state. However, as stated before, the output node N2 of the tristate buffer TB is supplied with the output of the inverter I2, therefore the output node N2 never enters the "HiZ" state.

<A-1-4. Structure of Reset Circuit>

Figure 4:
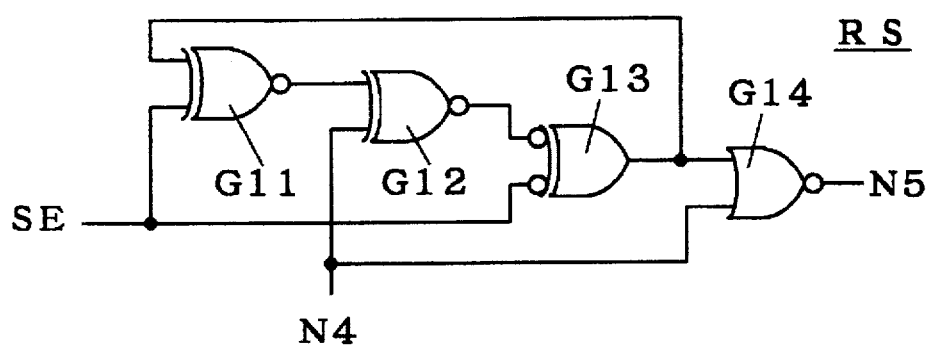
FIG. 4 is a diagram showing the structure of the reset circuit.

FIG. 4 shows the structure of the reset circuit RS. As shown in FIG. 4, the reset circuit RS includes EXNOR circuits G11 and G12, an inversion input EXOR circuit G13 and an NOR circuit G14.

The sense enable signal SE is supplied to one input of the EXNOR circuit G11 and one input of the inversion input EXOR circuit G13 and the output node N4 of the EXNOR circuit G1 is connected to one input of the EXNOR circuit G12 and one input of the NOR circuit G14. The output of the EXNOR circuit G11 is connected to the other input of the EXNOR circuit G12, the output of the EXNOR circuit G12 is connected to the other input of the inversion input EXOR circuit G13, and the output of the inversion input EXOR circuit G13 is connected to the other inputs of the NOR circuit G14 and the EXNOR circuit G11. The output of the NOR circuit G14 corresponds to the output node N5 of the reset circuit RS.

Figure 5:
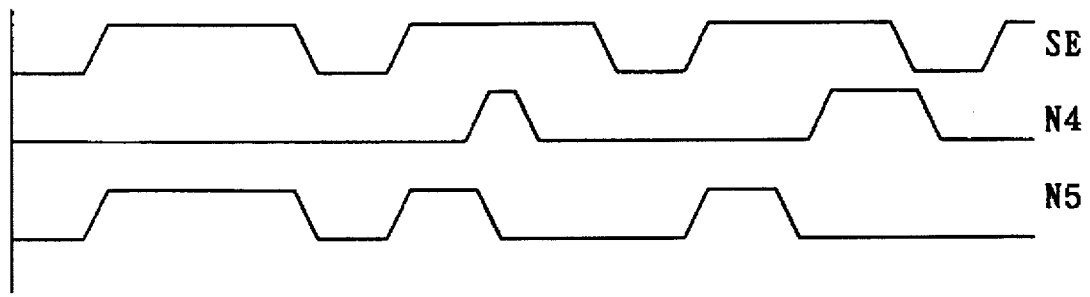
FIG. 5 is a timing chart for describing the operation of the reset circuit.

FIG. 5 shows the independent operation of the reset circuit RS. As shown in FIG. 5, when the output node N4 is in an "L" state, the sense enable signal SE passes through, and when the output node N4 attains an "H" state, the output node N5 goes to an "L" state. This is equal to the operation of bringing the sense enable signal SE in an "H" state to the "L" state on the way, and it is equal to the operation that the sense enable signal SE enters an inactive (disable) state.

While the output node N5 goes "L" at the timing when the output node N4 goes "H", when it once enters the "L" state (when it is reset), it maintains the "L" state until the sense enable signal SE attains "H" (that is, until it is set) next. This way, the reset circuit RS which substantially changes the sense enable signal SE can be referred to as signal changing means.

<A-2. Device Operation>

Next, the outline of the write and read operations of the SRAM 100 will be described. The data inputted from the data input port DI is amplified by the write driver WD which enters an active state when writing and complimentarily outputted onto the input/output lines IO and ĪŌ. At this time, the write address signal inputted from the address input port AD is decoded by the address decoder ADD, which selects any of the plurality of memory cell columns CC and any of the word lines WL1–WLn therein, and the data is written into the memory cell connected to that word line.

When reading data from a desired memory cell, a read address signal which specifies the desired memory cell is provided as input from the address input port AD to select any of the plurality of memory cell columns CC and any of the word lines WL1–WLn therein. When the desired memory cell is selected, data written therein is outputted onto the input/output lines IO and ĪŌ through the bit lines BL and B̄L̄. The following operation is closely related to the operation of the EXNOR circuit G1 and the reset circuit RS in the read block RB1, which will be described referring to the timing chart of FIG. 6.

Figure 6:
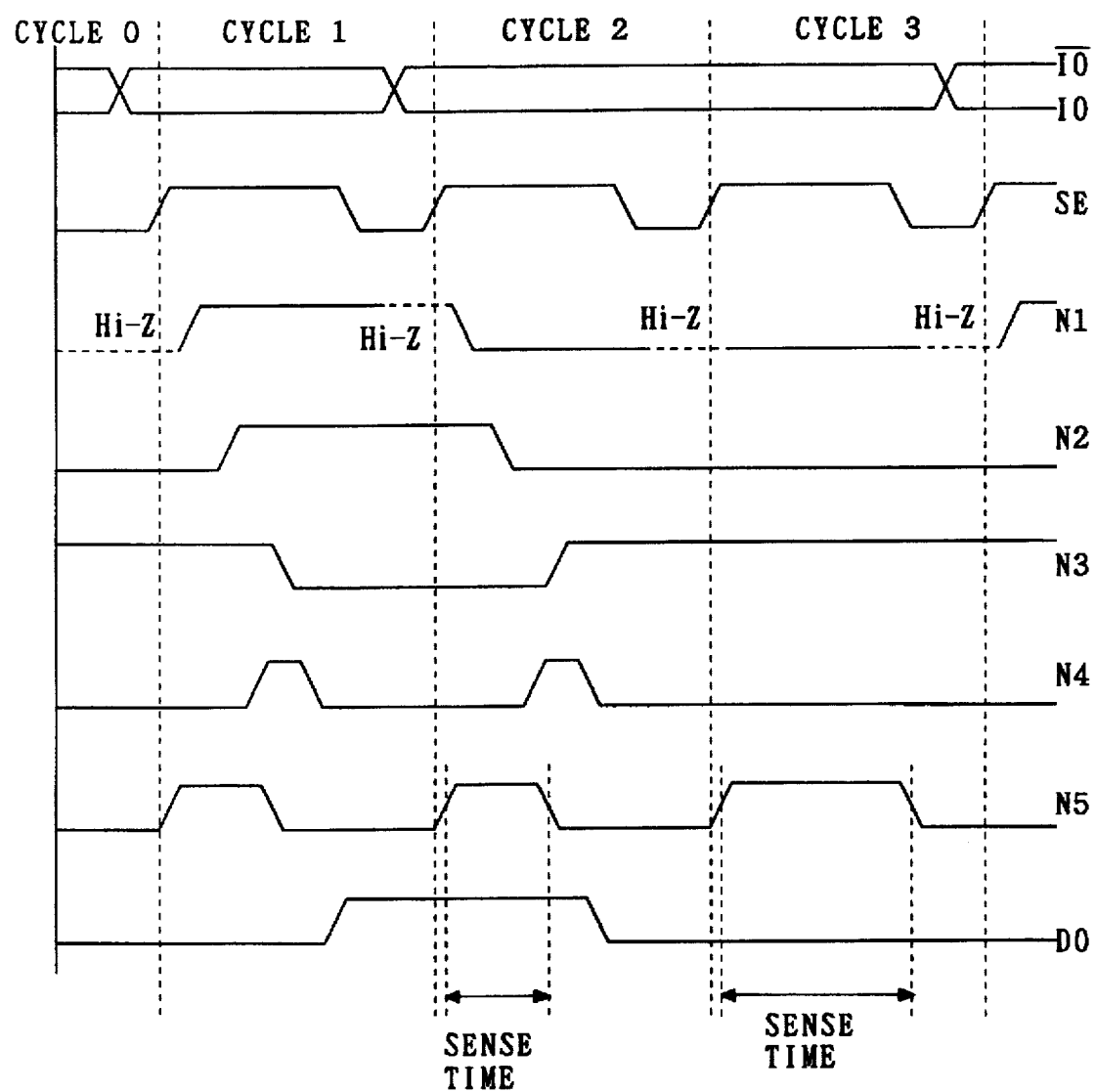
FIG. 6 is a timing chart for describing the operation of the semiconductor storage device of the first preferred embodiment of the present invention.

As shown in FIG. 6, the sense enable signal SE exhibits an "H" state and an "L" state alternately and regularly, where a set of "H" state and "L" state forms one cycle. In FIG. 6, the read data outputted onto the input/output lines IO and ĪŌ differ in the cycle 1 and the cycle 2 of the sense enable signal SE, and the read data outputted onto the input/output lines IO and ĪŌ is the same in the cycle 2 and the cycle 3.

Now, as shown in FIG. 6, since the output node N4 of the EXNOR circuit G1 is in an "L" state immediately before the cycle 1, the reset circuit RS intactly outputs the sense enable signal SE from the output node N5 as has been explained referring to FIG. 4. The sense amplifier SA and the tristate buffer TB are constituted so that they attain an active state when the output node N5 of the reset circuit RS is brought to an "H" state, as described referring to FIG. 2 and FIG. 3. Accordingly, in the period in which the output node N5 is in the "H" state, the read data is amplified by the sense amplifier SA and the tristate buffer TB and outputted from the output node N2.

As transmission delays occur in the sense amplifier SA and the tristate buffer TB, the output timing of the read data is somewhat shifted at the output nodes N1 and N2.

In the data holding means L1, the previous state is maintained for a while even after the cycle 1 has started, and the output node N2 is in an "L" state and the output node N3 is in an "H" state, and therefore the output node N4 of the EXNOR circuit G1 is in an "L" state.

When the data newly read in the cycle 1 reaches the data holding means L1 (when the output node N2 enters an "H" state), the output node N3 is in an "H" state and therefore the output node N4 of the EXNOR circuit G1 enters an "H" state, and then the output node N5 of the reset circuit RS enters an "L" state as explained referring to FIG. 4. This operation is equal to bringing the sense enable signal SE in an "H" state to an "L" state on the way.

Now, the EXNOR circuit G1 which detects a change of data latched in the data holding means L1 and outputs the result to the reset circuit RS can be referred to as data comparing means.

As has been described before, the reset circuit RS is a circuit which brings the output node N5 to an "L" state at the time when the output node N4 enters an "H" state. When it once enters an "L" state (when it is reset), it maintains the "L" state until the sense enable signal SE goes "H" next (i.e., until it is set).

The read data at the output node N3 is provided to the inverter I2, inversion-amplified again, provided to the output buffer OB through the output node N11, further amplified in the output buffer OB and provided to the data output port DO. As stated before, since the output node N11 is connected to the output node N2, the output node N2 maintains the "H" state even when the output node N5 enters an "L" state to bring the sense amplifier SA and the tristate buffer TB into an inactive state.

Next, when it changes from the cycle 1 to the cycle 2, the read data outputted onto the input/output lines IO and ĪŌ changes. The output node N4 of the EXNOR circuit G1 is in an "L" state immediately before the cycle 2 and therefore the sense enable signal SE is intactly outputted from the output node N5 of the reset circuit RS. In the period in which the output node N5 is in the "H" state, the read data is amplified in the sense amplifiers SA and the tristate buffer TB and outputted from the output node N2.

In the data holding means L1, the state just before is maintained for a while even after the cycle 2 has started, and the output node N2 is in an "H" state and the output node N3 is in an "L" state, and then the output node N4 of the EXNOR circuit G1 is in an "L" state.

When the data newly read in the cycle 2 reaches the data holding means L1 (when the output node N2 goes "L"), the output node N3 is at "L", and the output node N4 of the EXNOR circuit G1 goes "H". Hence, the output node N5 of the reset circuit RS goes "L". This is equal to the operation of bringing the sense enable signal SE in an "H" state to an "L" state on the way.

The read data at the output node N3 is applied to the inverter I2, inversion-amplified again, applied to the output buffer OB through the output node N11, further amplified in the output buffer OB and applied to the data output port DO.

Next, when it changes from the cycle 2 to the cycle 3, the read data outputted onto the input/output lines IO and ĪŌ does not change. The output node N4 of the EXNOR circuit G1 is in an "L" state immediately before the cycle 3, and the sense enable signal SE is outputted unchanged from the output node N5 of the reset circuit RS. In the period in which the output node N5 is in an "H" state, the read data is amplified in the sense amplifier SA and the tristate buffer TB and outputted from the output node N2.

As the read data is unchanged, the output node N2 maintains the "L" state and the output node N3 maintains the "H" state and then the output node N4 of the EXNOR circuit G1 maintains the "L" state. Accordingly, the sense enable signal SE in an "H" state is not substantially brought to an "L" state on the way.

The read data at the output node N3 is provided to the inverter I2, inversion-amplified again, provided to the output buffer OB through the output node N11, and further amplified in the output buffer OB and provided to the data output port DO.

<A-3. Characteristic Functions and Effects>

As has been stated above, in the cycle 1 and the cycle 2 in which read data outputted onto the input/output lines IO and ĪŌ changes between the cycles, bringing the sense enable signal SE in an "H" state to an "L" state substantially on the way optimizes the sense enable time. The active period of the sense amplifier SA is thus reduced when the held data and the currently read data differ, thereby reducing the power consumed in the sense amplifier SA.

In the cycle 1 and the cycle 2 shown in FIG. 6, the period in which the output node N5 of the reset circuit RS is in an "H" state, i.e., the period between the leading edge mesial point of the output node N5 and its trailing edge mesial point, is referred to as a sense time. The sense time, which covers the time until the output node N2 of the tristate buffer has completely changed, is long enough.

In the cycle 3 shown in FIG. 6, the period in which the output node N5 of the reset circuit RS is in an "H" state, i.e., the period from the leading edge mesial point of the output node N5 to its trailing edge mesial point is called a sense time. In this case, since it is the same as the period of the "H" state of the sense enable signal SE, the power consumed in the sense amplifier SA is not reduced. However, if this preferred embodiment is applied to a device in which read data outputted onto the input/output lines IO and ĪŌ often change between cycles, e.g., an image processing device, the effect of reducing the power consumption can be sufficiently obtained with a relatively simple structure.

<A-4. Modification>

Now, the period in which the output node N4 of the EXNOR circuit G1 is in an "H" state in the cycle 1 and the cycle 2 shown in FIG. 6 can be called a data change detecting period.

This data change detecting period is defined by the period from when the output node N2 changes to when the output node N3 changes. Accordingly, this data change detecting period can be lengthened by adding amplifying means (drivers, buffers, etc.) and logic inverting means (inverters, etc.) to the output nodes N2, N3, N11 and the data output port DO so that the period from the change at the output node N2 to the change at the output node N3 becomes longer.

The advantage of lengthening the data change detecting period lies in the fact that the output node N4 can be certainly put in an "H" state. That is to say, if the period from the change of the output node N2 to the change of the output node N3 is short, operation of semiconductor elements (transistor, etc.) forming the EXNOR circuit G1 can not follow the change and then the output node N4 can not be put in an "H" state certainly.

To set the data change detecting period to about 1 nanosecond (nsec), five to ten inverters are added to the inverter I1, for example.

In this case, the data may be taken out to detect the change of data in the data holding means L1 from any of the output nodes between the input of the data holding means L1 and the data output port DO, not limited only to the nodes N2 and N3.

<B. Second Preferred Embodiment>

<B-1. Device Structure>

As a second preferred embodiment of the semiconductor storage device according to the present invention, structure and operation of an SRAM 200 which performs input/output of 1-bit data will now be described referring to FIGS. 7–11.

<B-1-1. Structure of Read Block>

Figure 7:
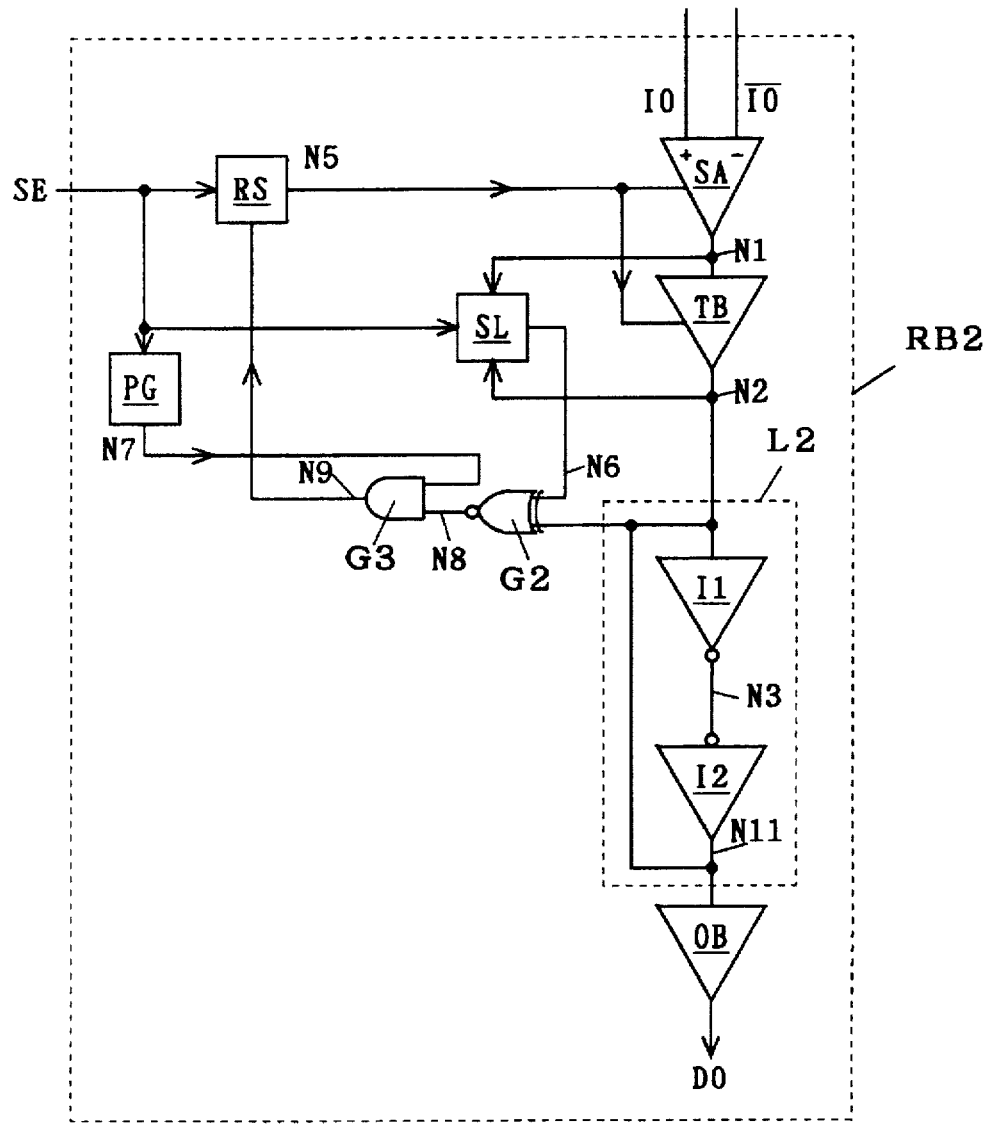
FIG. 7 is a diagram showing structure of a semiconductor storage device of a second preferred embodiment of the present invention.

FIG. 7 shows the structure of a read block RB2 of the SRAM 200. The structure in which the column selector CS, the memory cell columns CC, etc. are connected to the read block RB2 through the input/output lines IO and ĪŌ and the write driver WD is connected to the input/output lines IO and ĪŌ is the same as the SRAM 100 shown in FIG. 1, which are not shown in the figure for simplicity. The same structural elements as those in FIG. 1 are shown at the same reference characters and overlapping description is not provided here.

In FIG. 7, the output node N1 of the sense amplifier SA is connected to the input of the tristate buffer TB. The output node N2 of the tristate buffer TB is connected to the input of the inverter I1 constituting the data holding means L2 and the output node N3 of the inverter I1 is connected to the input of the inverter I2. The output node N2 of the tristate buffer TB is also connected to the output node N11 of the inverter I2 to form a loop path, the output node N11 is connected to the input of the output buffer OB and the output of the output buffer OB is connected to the data output port DO.

The output nodes N1 and N2 are connected to a selector SL (switching means) and the output node N6 of the selector SL is connected to one input of an EXNOR circuit G2. The output node N2 is connected to the other input of the EXNOR circuit G2 and the output node N8 of the EXNOR circuit G2 is connected to one input of an AND circuit G3.

The output node N9 of the AND circuit G3 is connected to the reset circuit RS. A sense enable signal SE is provided as input to the reset circuit RS and its output node N5 is connected to the sense amplifier SA and the tristate buffer TB. The sense amplifier SA and the tristate buffer TB enter an active state or an inactive state according to the signal provided from the output node N5, which amplify a potential difference between the signals read onto the bit lines BL and B̄L̄ and output it from the output node N2 in an active state.

The sense enable signal SE is also applied to the selector SL and a pulse generating means PG and the output node N7 of the pulse generating means PG is connected to the other input of the AND circuit G3.

<B-1-2. Structure of Pulse Generating Means>

Figure 8:
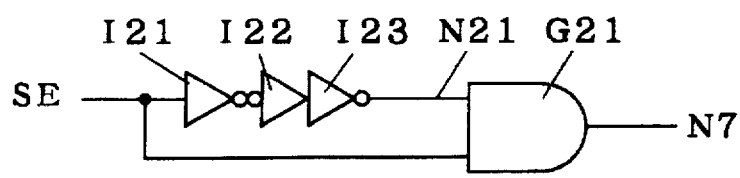
FIG. 8 is a diagram showing the structure of the pulse generating means.

FIG. 8 shows the structure of the pulse generating means PC. As shown in FIG. 8, the pulse generating means PG includes inverters I21–I23 connected in series and an AND circuit G21. In this structure, the sense enable signal SE is applied to one input of the AND circuit G21 and the input of the inverter I21. The output node N21 of the inverter I23 is connected to the other input of the AND circuit G21 and the output of the AND circuit G21 corresponds to the output node N7.

Figure 9:
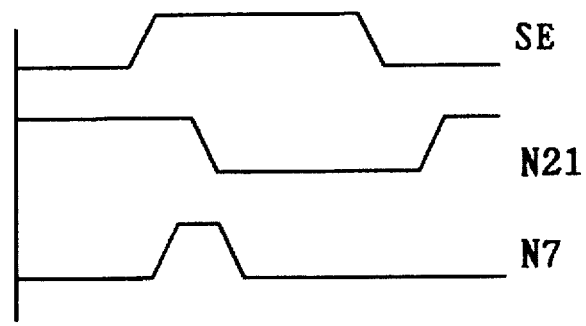
FIG. 9 is a timing chart illustrating the operation of the pulse generating means.

FIG. 9 shows the independent operation of the pulse generating means PC. As shown in FIG. 9, when the sense enable signal SE has entered an "H" state and a certain delay time in the inverters I21–I23 has passed, the output node N21 of the inverter I23 goes to an "L" state. The AND circuit G21 stays in an "H" state only in a period corresponding to the time difference between the timing of change of the sense enable signal SE and the timing of change of the signal at the output node N21. That is to say, it provides a pulse signal to the output node N7.

<B-1-3. Structure of Selector>

Figure 10:
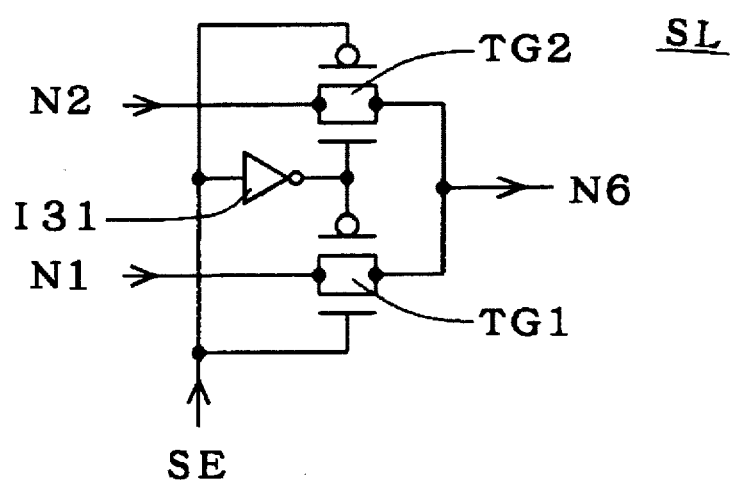
FIG. 10 is a diagram showing the structure of the selector.

FIG. 10 shows the structure of the selector SL. As shown in FIG. 10, the selector SL includes transmission gates TG1 and TG2 and an inverter I31.

The output nodes N1 and N2 are connected to the input terminals of the transmission gates TG1 and TG2 and the output terminals of the transmission gates TG1 and TG2 serve as the output node N6 in common. The sense enable signal SE is applied to the NMOS transistor side gate electrode of the transmission gate TG1 and the PMOS transistor side gate electrode of the transmission gate TG2, and an inversion signal of the sense enable signal SE is applied through the inverter I31 to the PMOS transistor side gate electrode of the transmission gate TG1 and the NMOS transistor side gate electrode of the transmission gate TG2.

In the selector SL having this structure, the data at the output node N1 is applied to the output node N6 when the sense enable signal SE is in an "H" state and the data at the output node N2 is applied to the output node N6 when the sense enable signal SE is in an "L" state.

<B-2. Device Operation>

The outline of the write and read operations of the SRAM 200 is the same as that of the SRAM 100, which are not described here. The operation carried out after data written in a desired memory cell is outputted onto the input/output lines IO and ĪŌ through the bit lines BL and B̄L̄ will be described referring to the timing chart shown in FIG. 11 because it is closely related to the operations of the EXNOR circuit G2 and the AND circuit G3, as data comparing means, the selector SL and the pulse generating means PG, and the reset circuit RS.

Figure 11:
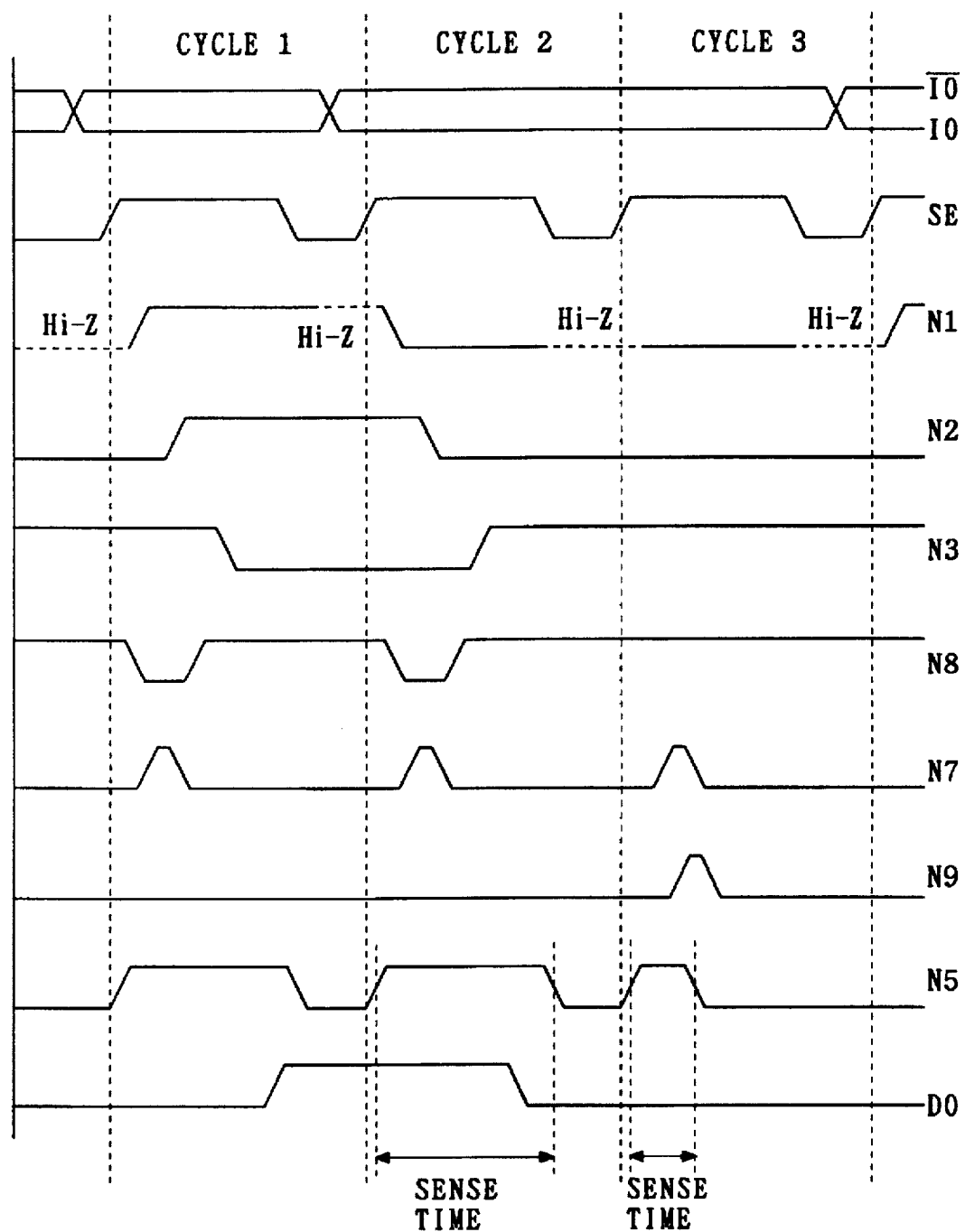
FIG. 11 is a timing chart for describing the operation of the semiconductor storage device of the second preferred embodiment according to the present invention.

As shown in FIG. 11, the sense enable signal SE exhibits an "H" state and an "L" state alternately and regularly, where a set of "H" state and "L" state forms one cycle. In FIG. 11, in the cycle 1 and the cycle 2 of the sense enable signal SE, the read data outputted onto the input/output lines IO and ĪŌ differ, and in the cycle 2 and the cycle 3, the read data outputted to the input/output lines IO and ĪŌ is the same.

Now, as shown in FIG. 11, the output node N8 of the EXNOR circuit G2 is in an "H" state immediately before the cycle 1 and the output node N7 of the pulse generating means PG is in an "L" state, so that the output node N9 of the AND circuit G3 is at "L". Accordingly, the reset circuit RS outputs the sense enable signal SE unchanged from the output node N5 as explained using FIG. 4. The sense amplifier SA and the tristate buffer TB are constructed to attain an active state when the output node N5 of the reset circuit RS is brought to an "H" state, as has been described referring to FIG. 2 and FIG. 3. Hence, in the period in which the output node N5 is in an "H" state, the read data is amplified in the sense amplifier SA and the tristate buffer TB and outputted from the output node N2.

Transmission delays occur in the sense amplifier SA and the tristate buffer TB, so that the output timing of the read data is slightly delayed at the output nodes N1 and N2.

In the data holding means L2, the previous state is maintained for a while after the cycle 1 has started, and the output node N2 is in an "L" state and the output node N3 is in an "H" state. When the data newly read in the cycle 1 is outputted from the output node N1 of the sense amplifier SA (when the output node N1 goes to an "H" state), the output node N2 of the tristate buffer TB is at L. Now, since the sense enable signal SE is in an "H" state, the data at the output node N1 is applied to the output node N6 of the selector SL. Accordingly, the output node N8 of the EXNOR circuit G2 goes to an "L" state.

When the output node N2 goes to an "H" state, then the output node N8 of the EXNOR circuit G2 goes to an "H" state.

In response to the sense enable signal SE brought to an "H" state, a pulse signal is applied to the output node N7 of the pulse generating means PG. Thus, the output node N9 of the AND circuit G3 maintains the "L" state and the reset circuit RS intactly outputs the sense enable signal SE from the output node N5.

The read data at the output node N3 is provided to the inverter I2, amplified again and provided to the output buffer OB through the output node N11 and further amplified in the output buffer OB and applied to the data output port DO.

Next, when it changes from the cycle 1 to the cycle 2, the read data outputted onto the input/output lines IO and ĪŌ changes. Immediately before the cycle 2, the output node N8 of the EXNOR circuit G2 is in an "H" state and the output node N7 of the pulse generating means PG is in an "L" state, and therefore the output node N9 of the AND circuit G3 is in an "L" state. Hence, the reset circuit RS intactly outputs the sense enable signal SE from the output node N5 as has been explained referring to FIG. 4.

In the data holding means L2, the state immediately before is maintained for a while even after the cycle 2 has started, and the output node N2 is in an "H" state and the output node N3 is in an "L" state. At the time when the data newly read in the cycle 2 is outputted from the node N1 of the sense amplifier SA (when the output node N1 enters an "L" state), the output node N2 of the tristate buffer TB is in an "H" state. Now, the sense enable signal SE is in an "H" state, and therefore the data at the output node N1 is applied to the output node N6 of the selector SL. Accordingly, the output node N8 of the EXNOR circuit G2 goes to an "L" state.

When the output node N2 enters an "L" state, the output node N8 of the EXNOR circuit G2 goes to an "H" state.

In response to the sense enable signal SE brought to an "H" state, a pulse signal is applied to the output node N7 of the pulse generating means PG. Thus the output node N9 of the AND circuit G3 maintains the "L" state and the reset circuit RS intactly outputs the sense enable signal SE from the output node N5.

The read data at the output node N3 is applied to the inverter I2, inversion-amplified again, applied to the output buffer OB through the output node N11, further amplified in the output buffer OB and then applied to the data output port DO.

17

Next, when it changes from the cycle 2 to cycle 3, the read data outputted onto the input/output lines IO and $\overline{\text{IO}}$ does not change. Immediately before the cycle 3, the output node N8 of the EXNOR circuit G2 is in an "H" state and the output node N7 of the pulse generating means PG is in an "L" state, so that the output node N9 of the AND circuit G3 is at "L". Accordingly, the reset circuit RS intactly outputs the sense enable signal SE from the output node N5 as has been described referring to FIG. 4.

In the cycle 3, however, the output node N2 is in an "L" state and the output node N3 is in an "H" state. When the data newly read in the cycle 3 is outputted from the output node N1 of the sense amplifier SA (when the output node N1 enters an "L" state), the output node N2 of the tristate buffer TB is in an "L" state. The sense enable signal SE is now in an "H" state and so the data at the output node N1 is applied to the output node N6 of the selector SL. Thus the output node N8 of the EXNOR circuit G2 stays in the "H" state.

While a pulse signal is applied to the output node N7 of the pulse generating means PG in response to the sense enable signal SE changing to an "H" state, the output node N8 of the EXNOR circuit G2 is in an "H" state, and therefore the output node N9 of the AND circuit G3 enters an "H" state in response to the pulse signal and the output node N5 of the reset circuit RS enters an "L" state. This is equal to the operation of bringing the sense enable signal SE at an "H" state to an "L" state on the way.

The read data at the output node N3 is applied to the inverter I2, inversion-amplified there again, applied to the output buffer OB through the output node N11, further amplified in the output buffer OB and provided to the data output port DO.

<B-3. Characteristic Functions and Effects>

As has been described above, in the cycle 3 in which the read data outputted onto the input/output lines IO and $\overline{\text{IO}}$ is unchanged as compared with the previous cycle, the sense enable time is optimized by substantially bringing the sense enable signal SE in an "H" state to an "L" state on the way to reduce the period in which the sense amplifier SA is in an active state, which enables a reduction of the power consumed in the sense amplifier SA when the held data and the currently read data are the same.

In the cycle 3 shown in FIG. 11, the period in which the output node N5 of the reset circuit RS is in an "H" state, i.e., the period between the leading edge mesial point of the output node N5 and its trailing edge mesial point is called a sense time. Now, it is sufficient that the sense time has a length enough to confirm that data does not change at the output nodes N1 and N2. Therefore the sense time is further reduced as compared with that in the first preferred embodiment in which it is necessary to cover the time until the output node N2 of the tristate buffer has completely changed.

In the cycle 1 and the cycle 2 shown in FIG. 11, the period in which the output node N5 of the reset circuit RS is in an "H" state, i.e., the period between the leading edge mesial point of the output node N5 and its trailing edge mesial point is called a sense time. In this case, since it is the same as the period in which the sense enable signal SE is in an "H" state, the power consumed in the sense amplifier SA can not be reduced. However, if this preferred embodiment is applied to a device in which the read data outputted onto the input/output lines IO and $\overline{\text{IO}}$ is often the same as in the previous cycle, e.g., an instruction memory which performs reading many times, a device having a large power consumption reducing effect can be obtained.

18

<B-4. Modification>

Now, in the cycle 1 and the cycle 2 shown in FIG. 11, the period in which the output node N8 of the EXNOR circuit G2 is in an "L" state can be called a data change detecting period.

The data change detecting period is defined by the period between the time when the output node N1 changes and when the output node N2 changes. Accordingly, adding amplifying means (a driver, a buffer, etc.), logic inversion means (an inverter etc.) to the output nodes N2, N3, N11 and the data output port DO to lengthen the period from the change at the output node N1 to the change at the output node N2 lengthens the data change detecting period.

The merit of lengthening the data change detecting period is that the output node N8 can be certainly placed in an "L" state. That is to say, if the period between the change at the output node N1 and the change at the output node N2 is short, the operation of semiconductor elements (transistors etc.) forming the EXNOR circuit G2 can not follow the change and then the output node N8 can not be certainly brought to an "L" state.

In this case, nodes from which data is taken out to detect the data change are not limited to the output nodes N1 and N2, but the data can be taken out from any output nodes between the output of the sense amplifier SA and the input of the data holding means L2.

In FIG. 7, the pulse signal at the output node N7 is generated on the basis of the sense enable signal SE using the pulse generating means PC, but the signal may be supplied from the outside independently of the sense enable signal SE. In this case, a specialized external clock signal is used, for example.

<C. Third Preferred Embodiment>

<C-1. Device Structure>

As a third preferred embodiment of the semiconductor storage device according to the present invention, structure and operation of an SRAM 300 making input/output of 1-bit data will be described referring to FIG. 12 and FIG. 13.

<C-1-1. Structure of Read Block>

Figure 12:
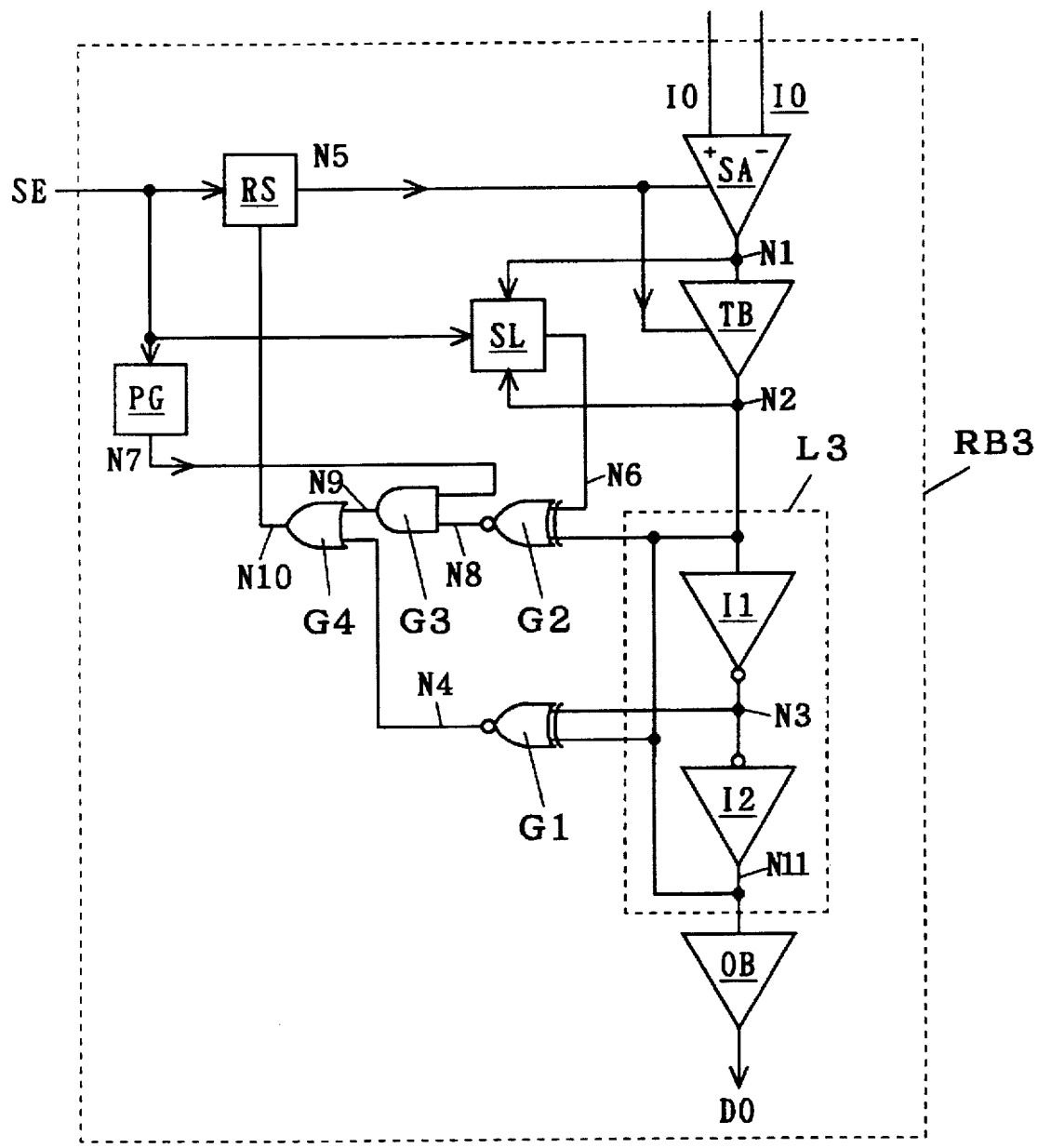
FIG. 12 is a diagram showing structure of a semiconductor storage device of a third preferred embodiment of the present invention.

FIG. 12 shows the structure of a read block RB3 of the SRAM 300. The structure in which the column selector CS, the memory cell columns CC, etc. are connected to the read block RB3 through the input/output lines IO and $\overline{\text{IO}}$ and the write driver WD is connected to the input/output lines IO and $\overline{\text{IO}}$ is the same as that of the SRAM 100 shown in FIG. 1, which are not shown in the figure for simplicity. The same structural elements as those in FIG. 1 are shown at the same reference characters and not described here.

In FIG. 12, the output node N1 of the sense amplifier SA is connected to the input of the tristate buffer TB. The output node N2 of the tristate buffer TB is connected to the input of the inverter I1 constituting the data holding means L3 and the output node N3 of the inverter I1 is connected to the input of the inverter I2. Here, the output node N2 of the tristate buffer TB is also connected to the output node N11 of the inverter I2 to form a loop path, and the output node N11 is connected to the input of the output buffer OB and the output of the output buffer OB is connected to the data output port DO.

The output nodes N1 and N2 are connected to the selector SL and the output node N6 of the selector SL is connected to one input of the EXNOR circuit G2. The output node N2 is connected to the other input of the EXNOR circuit G2 and the output node N8 of the EXNOR circuit G2 is connected to one input of the AND circuit G3.

The output node N9 of the AND circuit G3 is connected to one input of an OR circuit G4 and the output node N10 of the OR circuit G4 is connected to the reset circuit RS.

The sense enable signal SE is inputted to the reset circuit RS and its output node N5 is connected to the sense amplifier SA and the tristate buffer TB, where the sense amplifier SA and the tristate buffer TB enter an active or an inactive state according to the signal provided from the output node N5. In the case of an active state, a potential difference of the signals read onto the bit lines BL and $\overline{BL}$ is amplified and outputted from the output node N2.

The sense enable signal SE is also provided to the selector SL and the pulse generating means PG and the output node N7 of the pulse generating means PG is connected to the other input of the AND circuit G3.

The output nodes N2 and N3 are connected to the inputs of the EXNOR circuit G1 and the output node N4 of the EXNOR circuit G1 is connected to the other input of the OR circuit G4.

<C-2. Device Operation>

The outline of the write and read operations of the SRAM 300 is the same as that of the SRAM 100 and the SRAM 200, which is not repeatedly described here. The operation after data written in a desired memory cell is outputted onto the input/output lines IO and $\overline{IO}$ through the bit lines BL and $\overline{BL}$ closely relates to the operations of the EXNOR circuits G1 and G2, the AND circuit G3, the OR circuit G4, which form the data comparing means, the selector SL and the pulse generating means PG, and the reset circuit RS, which is described referring to the timing chart shown in FIG. 13.

Figure 13:
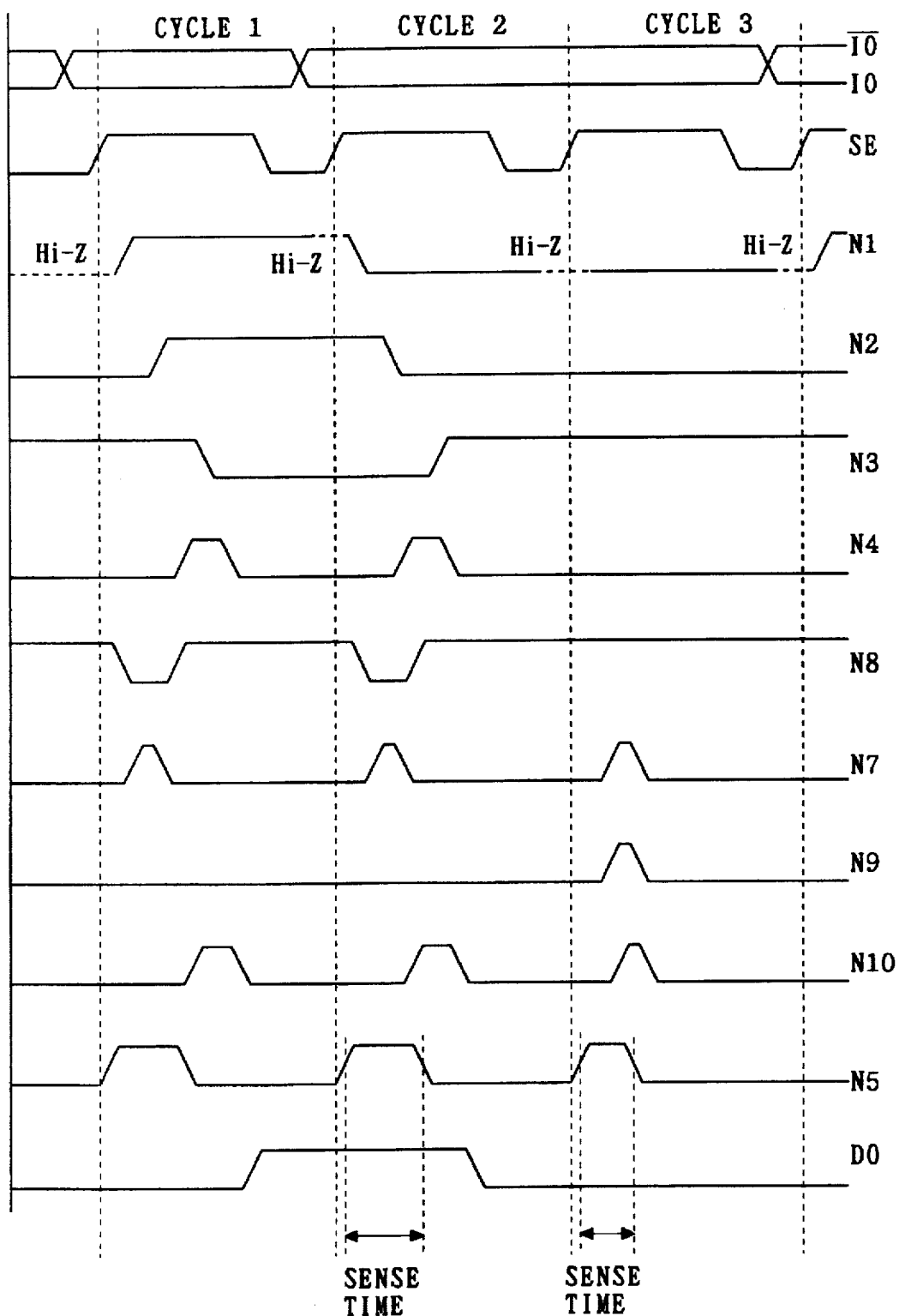
FIG. 13 is a timing chart for describing the operation of the semiconductor storage device of the third preferred embodiment of the present invention.
Figure 14:
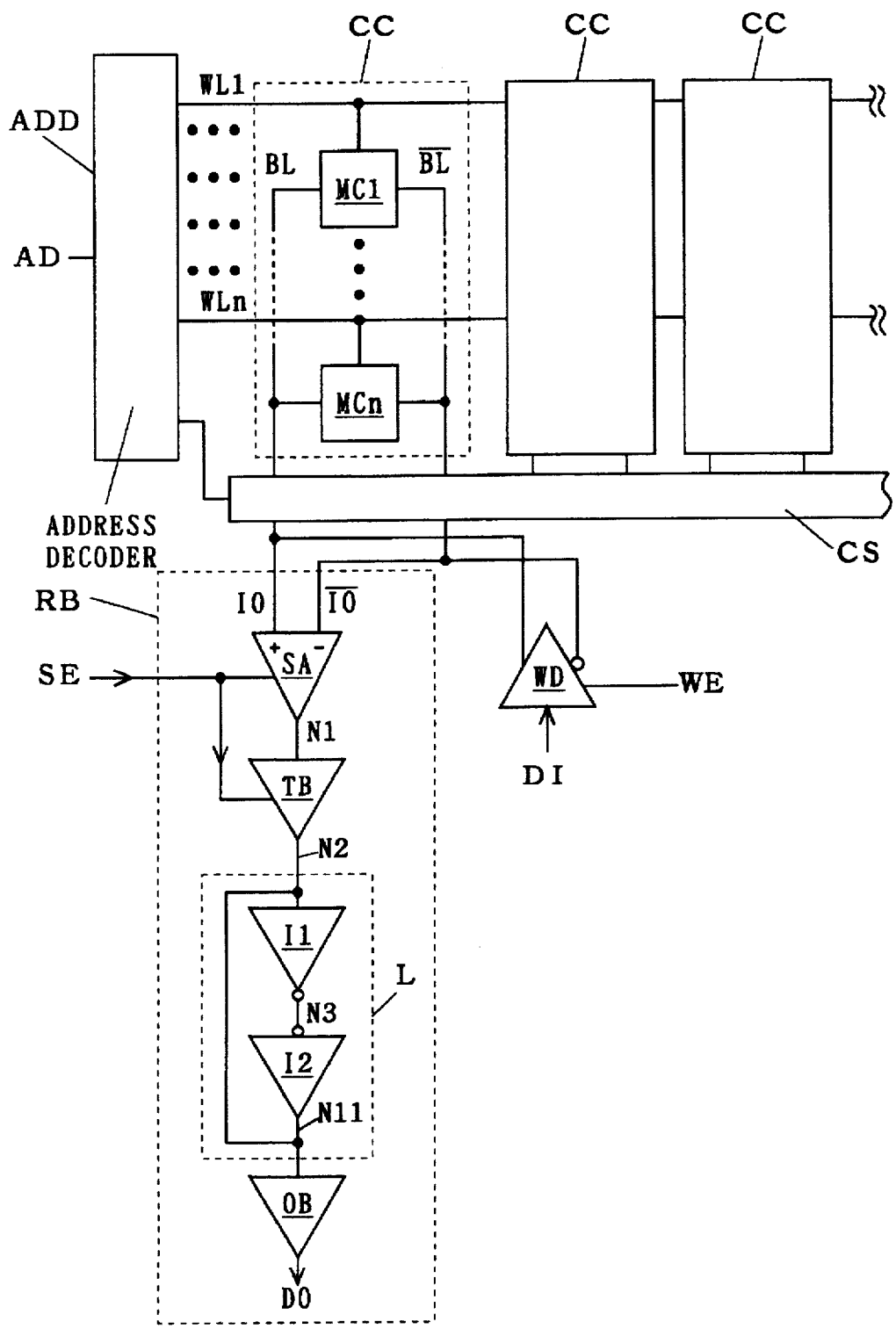
FIG. 14 is a diagram showing structure of a conventional semiconductor storage device.
Figure 15:
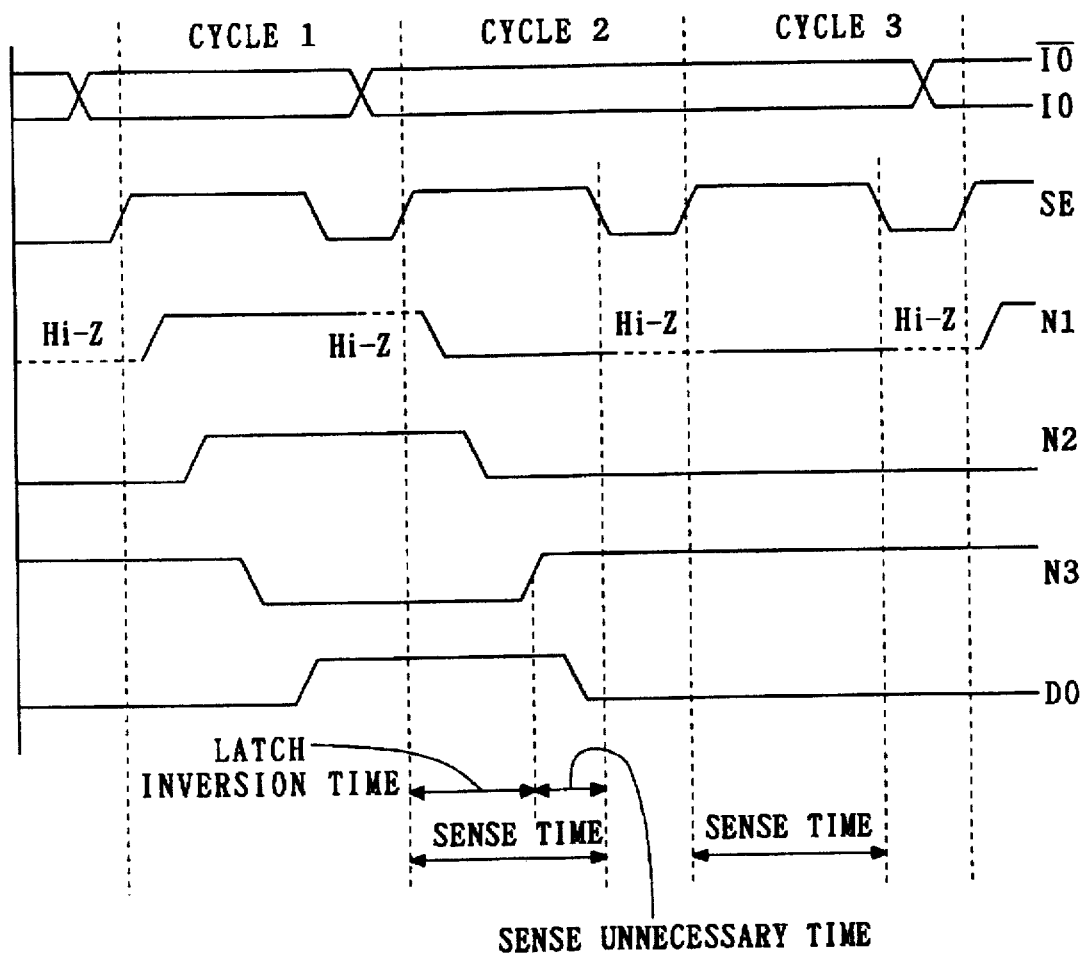
FIG. 15 is a timing chart for describing the operation of the conventional semiconductor storage device.

As shown in FIG. 13, the sense enable signal SE is provided with an "H" state and an "L" state alternately and regularly, where a set of "H" state and "L" state forms one cycle. In FIG. 13, the read data outputted onto the input/output lines IO and $\overline{IO}$ differ in the cycle 1 and the cycle 2 of the sense enable signal SE and the read data outputted onto the input/output lines IO and $\overline{IO}$ is the same in the cycle 2 and the cycle 3.

Here, as shown in FIG. 13, the output node N4 of the EXNOR circuit G1 is in an "L" state immediately before the cycle 1. The output node N8 of the EXNOR circuit G2 is in an "H" state and the output node N7 of the pulse generating means PG is in an "L" state, so that the output node N9 of the AND circuit G3 is in an "L" state. Accordingly, the output node N10 of the OR circuit G4 is in an "L" state and the reset circuit RS intactly outputs the sense enable signal SE from the output node N5.

The sense amplifier SA and the tristate buffer TB are structured to enter an active state when the output node N5 of the reset circuit RS is brought into an "H" state, as has been stated referring to FIG. 2 and FIG. 3. Hence, in the period in which the output node N5 is in an "H" state, the read data is amplified by the sense amplifier SA and the tristate buffer TB and outputted from the output node N2.

Since transmission delays occur in the sense amplifier SA and the tristate buffer TB, the output timing of the read data is slightly shifted at the output nodes N1 and N2.

In the data holding means L3, the state immediately before is maintained even after the cycle 1 has started, and the output node N2 is in an "L" state and the output node N3 is in an "H" state.

When data newly read in the cycle 1 reaches the data holding means L1 (when the output node N2 enters an "H" state), then the output node N3 is in an "H" state and therefore the output node N4 of the EXNOR circuit G1 enters an "H" state.

When the data newly read in the cycle 1 is outputted from the output node N1 of the sense amplifier SA (when the output node N1 enters an "H" state), the output node N2 is at L. Here, the sense enable signal SE is in an "H" state and therefore the data at the output node N1 is applied to the output node N6 of the selector SL. Hence, the output node N8 of the EXNOR circuit G2 goes into an "L" state.

Then, when the output node N2 enters an "H" state, the output node N8 of the EXNOR circuit G2 enters an "H" state.

In response to the sense enable signal SE entering an "H" state, a pulse signal is applied to the output node N7 of the pulse generating means PG and the output node N9 of the AND circuit G3 maintains an "L" state. Accordingly, the output node N10 of the OR circuit G4 enters an "H" state with a change at the output node N4, and the output node N10 enters an "L" state when the output node N4 enters an "L" state.

When the output node N10 attains an "H" state, the output node N5 of the reset circuit RS enters an "L" state. This is equal to the operation of bringing the sense enable signal SE in an "H" state to an "L" state on the way.

The read data at the output node N3 is applied to the inverter I2, inversion-amplified again, applied to the output buffer OB through the output node N11, and further amplified in the output buffer OB and applied to the data output port DO.

Next, when the cycle 1 changes to the cycle 2, the read data outputted onto the input/output lines IO and $\overline{IO}$ changes. Immediately before the cycle 2, the output node N8 of the EXNOR circuit G2 is in an "H" state and the output node N7 of the pulse generating means PG is in an "L" state, and therefore the output node N9 of the AND circuit G3 is in an "L" state. The output node N4 of the EXNOR circuit G1 is in an "L" state. Hence the output node N10 of the OR circuit G4 is in an "L" state and the sense enable signal SE is intactly outputted from the output node N5 of the reset circuit RS. In the period in which the output node N5 is in an "H" state, the read data is amplified in the sense amplifier SA and the tristate buffer TB and outputted from the output node N2.

The data holding means L3 maintains the previous state for a while even after the cycle 2 has started, where the output node N2 is in an "H" state and the output node N3 is in an "L" state and then the output node N4 of the EXNOR circuit G1 is in an "L" state.

Then, when data newly read in the cycle 2 reaches the data holding means L1 (when the output node N2 enters an "L" state), then the output node N3 is in an "L" state and so the output node N4 of the EXNOR circuit G1 goes to an "H" state.

When data newly read in the cycle 2 is outputted from the output node N1 of the sense amplifier SA (when the output node N1 enters an "L" state), then the output node N2 of the tristate buffer TB is in an "H" state. Here, since the sense enable signal SE is in an "H" state, the data at the output node N1 is applied to the output node N6 of the selector SL. Hence the output node N8 of the EXNOR circuit G2 goes to an "L" state.

Then, when the output node N2 enters an "L" state, the output node N8 of the EXNOR circuit G2 enters an "H" state.

In response to the sense enable signal SE changing into the "H" state, a pulse signal is applied to the output node N7 of the pulse generating means PG and the output node N9 of the AND circuit G3 maintains the "L" state. Accordingly, with a change at the output node N4, the output node N10 of the OR circuit G4 enters an "H" state and when the output node N4 enters an "L" state, then the output node N10 also enters an "L" state.

When the output node N10 enters an "H" state, the output node N5 of the reset circuit RS enters an "L" state. This is equal to the operation of bringing the sense enable signal SE at an "H" state to an "L" state on the way.

Next, when the cycle changes from 2 to 3, the read data outputted onto the input/output lines IO and $\overline{IO}$ does not change. Immediately before the cycle 3, the output node N8 of the EXNOR circuit G2 is in an "H" state and the output node N7 of the pulse generating means PG is in an "L" state, and so the output node N9 of the AND circuit G3 is at "L". Immediately before the cycle 3, the output node N4 of the EXNOR circuit G1 is in an "L" state and therefore the output node N10 of the OR circuit G4 is at "L" and the reset circuit RS outputs the sense enable signal SE intactly from the output node N5.

In the cycle 3, however, the output node N2 is in an "L" state and the output node N3 is in an "H" state. When the data newly read in the cycle 3 is outputted from the output node N1 of the sense amplifier SA (when the output node N1 enters an "L" state), the output node N2 of the tristate buffer TB is in an "L" state. Here, since the sense enable signal SE is in an "H" state, the data at the output node N1 is applied to the output node N6 of the selector SL. Accordingly, the output node N8 of the EXNOR circuit G2 maintains the "H" state.

In response to the sense enable signal SE changing to an "H" state, a pulse signal is applied to the output node N7 of the pulse generating means PC. Then since the output node N8 of the EXNOR circuit G2 is in an "H" state, the output node N9 of the AND circuit G3 attains an "H" state in response to the pulse signal.

Since the read data does not change, the output node N2 maintains the "L" state and the output node N3 maintains the "H" state, and the output node N4 of the EXNOR circuit G1 maintains the "L" state. Thus, the output node N10 of the OR circuit G4 goes to an "H" state and the output node N5 of the reset circuit RS enters an "L" state. This is equal to the operation of bringing the sense enable signal SE in an "H" state into an "L" state on the way.

<C-3. Characteristic Functions and Effects>

As have been explained above, in the cycle 1 and the cycle 2 in which the read data outputted to the input/output lines IO and $\overline{IO}$ changes between cycles, the sense enable signal SE in an "H" state is substantially brought into an "L" state on the way. In the cycle 3 in which the read data outputted onto the input/output lines IO and $\overline{IO}$ is the same as in the previous cycle, the sense enable signal SE in an "H" state is substantially brought into an "L" state on the way. Thus the sense enable time is optimized to reduce the period in which the sense amplifier SA is in an active state. This considerably reduces power consumed in the sense amplifier SA both when the held data and the currently read data differ and when they are the same.

<C-4. Modification>

Here, similarly to the first preferred embodiment and the second preferred embodiment, amplifying means (driver, buffer, etc.) or logic inverting means (inverter etc.) may be added to the output nodes N2, N3, N11 and the data output port DO to adjust the data change detecting periods, i.e., the period in which the output node N4 of the EXNOR circuit G1 is in an "H" state and the period in which the output node N8 of the EXNOR circuit G2 is in an "L" state, to certainly place the output node N4 into an "H" state and the output node N8 into an "L" state.

While the invention has been described in detail, the foregoing description is in all aspects illustrative and not restrictive. It is understood that numerous other modifications and variations can be devised without departing from the scope of the invention.

We claim:

1. A semiconductor storage device comprising data reading means for reading data held in a memory cell, wherein said data reading means comprises, sense amplifying means responsive to a read control signal periodically provided for amplifying and outputting said data, data holding means receiving an output of said sense amplifying means for temporarily holding said data and then outputting said data to an external output terminal, data comparing means for comparing held data outputted from said sense amplifying means in a first cycle of said read control signal and held in said data holding means and before-held data outputted from said sense amplifying means in a second cycle of said read control signal and not held in said data holding means yet to output its comparison result, and signal changing means connected to said data comparing means for changing said read control signal according to said comparison result, wherein said read control signal includes, in its one cycle, an activating signal for activating said sense amplifying means so that said data is amplified and outputted, and a deactivating signal for deactivating said sense amplifying means, and said signal changing means forces said activating signal to change to said deactivating signal when said comparison result exhibits a predetermined result.

2. The semiconductor storage device according to claim 1, wherein said predetermined result is a result showing that said before-held data and said held data differ, wherein said data comparing means has a combinational logic circuit having its one input connected to a node allowing detection of said held data and its other input connected to a node allowing detection of said before-held data, for outputting a pulse-like comparison result signal only when said before-held data and said held data differ.

3. The semiconductor storage device according to claim 2, wherein said data holding means comprises at least one first signal inverting means and at least one second signal inverting means connected in series, wherein the output of said sense amplifying means is applied to an input node of said at least one first signal inverting means and an output of said at least one second signal inverting means is connected to said external output terminal and also connected to the output side of said sense amplifying means to form a loop path, said node allowing detection of said held data is an output node of said at least one first signal inverting means, and said node allowing detection of said before-held data is the input node of said at least one first signal inverting means.

4. The semiconductor storage device according to claim 3, wherein said combinational logic circuit is an EXNOR circuit.

5. The semiconductor storage device according to claim 1, wherein said predetermined result is a result showing that said before-held data and said held data are the same, wherein said data comparing means includes, a first combinational logic circuit having its one input connected to a node allowing detection of said held data and its other input connected to a node allowing detection of said before-held data, for outputting a pulse-like signal only when said before-held data and said held data differ, and a second combinational logic circuit receiving an output of said first combinational logic circuit and a pulse-like timing signal provided in correspondence with timing of supply of said activating signal, for outputting a pulse-like comparison result signal corresponding to said timing signal only when said before-held data and said held data are the same.

6. The semiconductor storage device according to claim 5, wherein said data reading means includes delay means interposed between the output portion of said sense amplifying means and the input portion of said data holding means for delaying said data for a predetermined period and outputting said data, wherein said data comparing means includes, switching means receiving the output of said sense amplifying means and the output of said delay means, for outputting the output of said sense amplifying means in a period in which said activating signal of said read control signal is provided and outputting the output of said delay means in a period in which said deactivating signal of said read control signal is provided, and pulse generating means receiving said read control signal for generating said timing signal in correspondence with timing of supply of said activating signal, and said data holding means includes, at least one first signal inverting means and at least one second signal inverting means connected in series, wherein an input node of said at least one first signal inverting means is supplied with the output of said sense amplifying means and an output of said at least one second signal inverting means is connected to said external output terminal and also connected to the output side of said sense amplifying means to form a loop path, wherein said node allowing detection of said held data is the input node of said at least one first signal inverting means, and said node allowing detection of said before-held data is the output node of said switching means.

7. The semiconductor storage device according to claim 6, wherein said first combinational logic circuit is an EXNOR circuit, and said second combinational logic circuit is an AND circuit.

8. The semiconductor storage device according to claim 1, wherein said predetermined result includes, a first result showing that said before-held data and said held data differ, and a second result showing that said before-held data and said held data are the same, wherein said data comparing means includes, a first combinational logic circuit having its one input connected to a first node allowing detection of said held data and its other input connected to a second node allowing detection of said before-held data, for outputting a pulse-like first comparison result signal only when said before-held data and said held data differ, a second combinational logic circuit having its one input connected to a third node allowing detection of said held data and its other input connected to a fourth node allowing detection of said before-held data, for outputting a pulse-like signal only when said before-held data and said held data differ, a third combinational logic circuit receiving the output of said second combinational logic circuit and a pulse-like timing signal provided in correspondence with timing of supply of said activating signal, for outputting a pulse-like second comparison result signal corresponding to said timing signal only when said before-held data and said held data are the same, and a fourth combinational logic circuit receiving the output of said first combinational logic circuit and the output of said third combinational logic circuit, for outputting said first comparison result signal when said before-held data and said held data differ and outputting said second comparison result signal when said before-held data and said held data are the same.

9. The semiconductor storage device according to claim 8, wherein said data reading means includes delay means interposed between the output portion of said sense amplifying means and the input portion of said data holding means for delaying said data for a predetermined period and outputting said data, wherein said data comparing means includes, switching means receiving the output of said sense amplifying means and the output of said delay means, for outputting the output of said sense amplifying means in a period in which said activating signal of said read control signal is provided and outputting the output of said delay means in a period in which said deactivating signal of said read control signal is provided, and pulse generating means receiving said read control signal for generating said timing signal in correspondence with timing of supply of said activating signal, and said data holding means includes, at least one first signal inverting means and at least one second signal inverting means connected in series, wherein the output of said sense amplifying means is applied to an input node of said at least one first signal inverting means and an output of said at least one second signal inverting means is connected to said external output terminal and also connected to the output side of said sense amplifying means to form a loop circuit, said first node allowing detection of said held data is an output node of said at least one first signal inverting means, said second node allowing detection of said before-held data is the input node of said at least one first signal inverting means, said third node allowing detection of said held data is the input node of said at least one first signal inverting means, and said fourth node allowing detection of said before-held data is the output node of said switching means.

10. The semiconductor storage device according to claim 9, wherein said first combinational logic circuit is an EXNOR circuit, said second combinational logic circuit is an EXNOR circuit, said third combinational logic circuit is an AND circuit, and said fourth combinational logic circuit is an OR circuit.

* * * * *